(12) United States Patent
Behfar et al.

(10) Patent No.: US 8,605,767 B2
(45) Date of Patent: Dec. 10, 2013

(54) LONG SEMICONDUCTOR LASER CAVITY IN A COMPACT CHIP

(75) Inventors: Alex A. Behfar, Keswick, VA (US);
Cristian Stagarescu, Ithaca, NY (US)

(73) Assignee: Binoptics Corporation, Ithaca, NY (US)

( * ) Notice: Subject to any disclaimer, the term of this patent is extended or adjusted under 35 U.S.C. 154(b) by 93 days.

(21) Appl. No.: 13/281,408

(22) Filed: Oct. 25, 2011

(65) Prior Publication Data
US 2012/0099613 A1   Apr. 26, 2012

Related U.S. Application Data

(60) Provisional application No. 61/406,529, filed on Oct. 25, 2010.

(51) Int. Cl.
*H01S 3/08* (2006.01)
*H01S 3/081* (2006.01)

(52) U.S. Cl.
USPC .................................. 372/92; 372/93; 372/99

(58) Field of Classification Search
USPC ................................................ 372/92, 93, 99
See application file for complete search history.

(56) References Cited

U.S. PATENT DOCUMENTS

| | | | |
|---|---|---|---|
| 3,943,462 A * | 3/1976 | Thompson | 372/49.01 |
| 4,658,402 A * | 4/1987 | Kobayashi | 372/50.124 |
| 4,698,823 A | 10/1987 | Cote | |
| 5,132,983 A | 7/1992 | Behfar-Rad | |
| 5,235,658 A | 8/1993 | Dragone et al. | |
| 2003/0026317 A1 | 2/2003 | Behfar et al. | |
| 2005/0123016 A1 | 6/2005 | Behfar et al. | |
| 2005/0147145 A1 | 7/2005 | Behfar et al. | |
| 2007/0045637 A1 | 3/2007 | Behfar et al. | |
| 2010/0091810 A1 | 4/2010 | Behfar et al. | |

OTHER PUBLICATIONS

International Preliminary Report on Patentability for PCT/US2011/057764, dated Apr. 30, 2013.

* cited by examiner

*Primary Examiner* — Armando Rodriguez
(74) *Attorney, Agent, or Firm* — William A. Blake

(57) ABSTRACT

Long semiconductor laser cavities are placed in relative short length chips through the use of total internal reflection (TIR) surfaces formed through etched facets. In one embodiment, a laser cavity is formed along the perimeter edges of a rectangular semiconductor chip by using three 45° angled TIR facets to connect four legs of a ridge or buried heterostructure (BH) waveguide that defines the laser cavity. In other embodiments, even more TIR facets and waveguide legs or sections are employed to make even longer laser cavities in the shape of rectangular or quadrilateral spirals. These structures are limited in the spacing of adjacent waveguide sections, which if too small, can cause undesirable coupling between the sections. However, use of notches etched between the adjacent sections have been shown to decrease this coupling effect.

21 Claims, 14 Drawing Sheets

240

325

585

2010

LONG SEMICONDUCTOR LASER CAVITY IN A COMPACT CHIP

CROSS REFERENCE TO RELATED APPLICATIONS

This application claims the benefit, under 35 USC 119(e), of U.S. Provisional Application No. 61/406,529, filed Oct. 25, 2010, the disclosure of which is hereby incorporated by reference in its entirety.

BACKGROUND OF THE INVENTION

1. Field of the Invention

This invention relates to semiconductor diode lasers and, more specifically, to fitting a long cavity laser in a compact chip using total internal reflection surfaces formed through etched facets.

2. Description of the Related Art

Semiconductor lasers typically are fabricated on a wafer by growing an appropriate layered semiconductor material on a substrate through Metalorganic Chemical Vapor Deposition (MOCVD) or Molecular Beam Epitaxy (MBE) to form an epitaxial structure having an active layer parallel to the substrate surface. The wafer is then processed with a variety of semiconductor processing tools to produce a laser optical cavity incorporating the active layer and incorporating metallic contacts attached to the semiconductor material. Laser facets are typically formed at the ends of the laser cavity by cleaving the semiconductor material along its crystalline structure to define edges, or ends, of the laser optical cavity so that when a bias voltage is applied across the contacts, the resulting current flow through the active layer causes photons to be emitted out of the faceted edges of the active layer in a direction perpendicular to the current flow. Since the semiconductor material is cleaved to form the laser facets, the locations and orientations of the facets are limited; furthermore, once the wafer has been cleaved, typically it is in small pieces so that conventional lithographical techniques cannot readily be used to further process the lasers.

The foregoing and other difficulties resulting from the use of cleaved facets led to the development of a process for forming the facets of semiconductor lasers through etching. This process, as described in U.S. Pat. No. 4,851,368, also allows lasers to be monolithically integrated with other photonic devices on the same substrate, the disclosure of which is hereby incorporated herein by reference. This work was further extended and a ridge laser process based on etched facets was disclosed in the IEEE Journal of Quantum Electronics, volume 28, No. 5, pages 1227-1231, May 1992, the disclosure of which is hereby incorporated herein by reference.

The formation of total-internal-reflection (TIR) facets within an optical cavity through the use of etched facets at angles greater than the critical angle for light propagating within the cavity was also disclosed in U.S. Pat. No. 4,851,368 for broad area lasers and U.S. Pat. No. 5,031,190 for ridge lasers, the disclosures of which are hereby incorporated herein by reference.

High power semiconductor lasers are of significant interest for many applications, such as optical storage applications. As the power requirements for semiconductor lasers has increased, manufacturers have simply increased the cavity length of the laser chip, as shown in the graph of FIG. 1 from U.S. Patent Application 2006/0274802, where chip lengths are over 2000 μm long for 400 mW power required for double layer DVD applications. US Patent Application 2006/0274802, the disclosure of which is hereby incorporated herein by reference, states: "high power of a laser is demanded to improve a writing speed of an optical recording disk and therefore, an increase in laser resonator length is absolutely necessary to attain the high power. In this case, there is a problem in that the increase in chip size incurs a rise in chip cost." This patent application also introduces a tapered multimode interference (MMI) waveguide in the middle of a ridge laser diode allowing the chip length to be reduced to 1300 μm for 300 mW output, resulting in a chip length that is about two-thirds of the chip length for a standard ridge laser (without the tapered MMI).

Early efforts using total internal reflection (TIR) facets included the following. "Rectangular and L-shaped GaAs—AlGaAs lasers with very high quality etched facets," Applied Physics letters, Vol. 54, page 493, used a 45° TIR etched facet to demonstrate broad area L-shaped laser. "Continuous-wave operation and mirror loss of a U-shaped GaAs/AlGaAs laser diode with two totally reflecting mirrors," Applied Physics letters, Vol. 56, page 1617, described a broad-area laser with two TIR facets, using cleaved front and back facets. "CW operation of folded-cavity semiconductor lasers with etched turning mirrors," Electronic Letters, Vol. 28, page 21 described a folded cavity using ridge lasers of 80 and 5 μm ridge width with a cleaved back facet. "Precise determination of turning mirror loss using GaAs/AlGaAs lasers with up to ten 90° intracavity turning mirrors," IEEE Photonics Technology Letters, Vol. 4, page 24, used wide ridge lasers with 10 μm ridge width with cleaved front and back facets.

The market continues to demand increased numbers of chips from a given wafer for variety of high power applications, such as DVD and Blu-ray read/write systems.

SUMMARY OF THE INVENTION

According to the present invention, a large semiconductor laser cavity is placed in a relative short length chip through the use of total internal reflection (TIR) surfaces formed through etched facets.

In one embodiment, a laser cavity is formed along the perimeter edges of a rectangular semiconductor chip by using three 45° angled TIR facets to connect four legs of a ridge or buried heterostructure (BH) waveguide that defines the laser cavity. In other embodiments, even more TIR facets and waveguide legs or sections are employed to make even longer laser cavities in the shape of rectangular or quadrilateral spirals. These structures are limited first in the spacing of adjacent waveguide sections, which if too small, can cause undesirable coupling between the sections. However, use of notches etched between the adjacent sections has been shown to decrease this coupling effect. A second limitation in the spiral structured cavities is the size of the open area in the center of the spirals which must allow for a minimum bond pad diameter or width (e.g. 50 μm). However, the need for an open area can be eliminated if the bond pad is placed above at least a portion of the laser cavity.

BRIEF DESCRIPTION OF THE DRAWINGS

The foregoing and additional objects, features and advantages of the invention will become apparent to those of skill in the art from the following detailed description of the invention taken with the accompanying drawings, which are briefly described as follows.

DETAILED DESCRIPTION OF THE INVENTION

Figure 1:
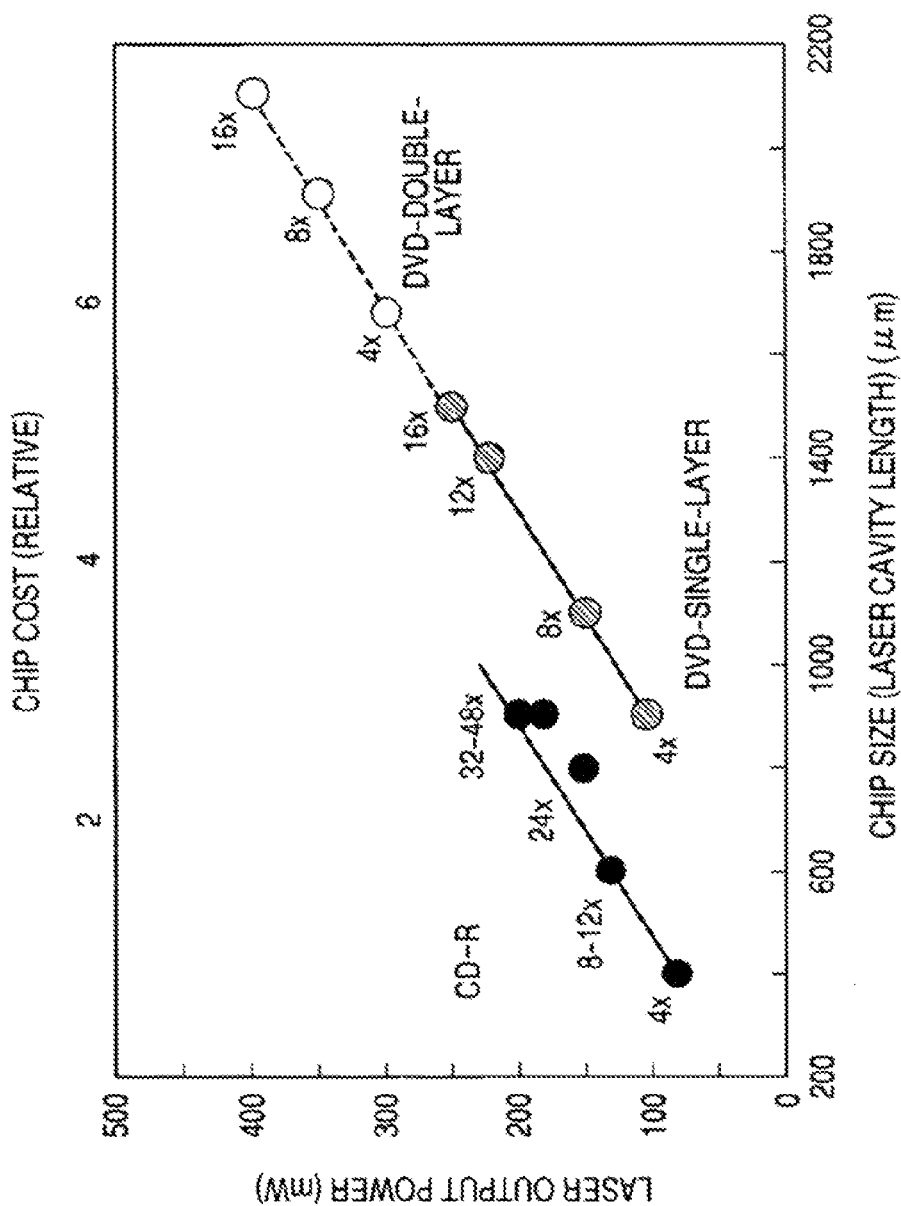
FIG. 1 is a graph taken from US Patent Application 2006/0274802 that illustrates the cavity length required for a ridge-type semiconductor laser for use in CD and DVD applications.
Figure 2D:
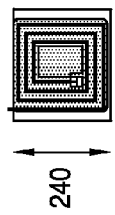
FIGS. 2A-2D show a 2000 µm long etched facet ridge waveguide laser cavity fitted in chips all of 250 µm width, using: (a) no total internal reflection (TIR) facets resulting in a chip length of 2010 µm; (b) four TIR facets resulting in a chip length of 585 µm; (c) eight TIR facets resulting in a chip length of 325 µm; and (d) twelve TIR facets resulting in a chip length of 240 µm.
Figure 2C:
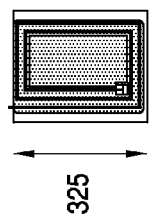
Figure 2B:
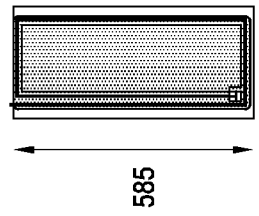
Figure 2A:
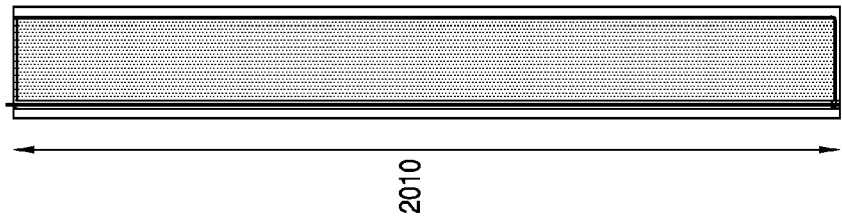

Turning now to a more detailed description of the invention, FIGS. 2A-2D illustrate several examples of a 2000 µm long etched facet ridge laser cavity fitted in laser chips, all of 250 µm width. FIGS. 2B through 2D show examples where the cavity lengths are significantly longer than the chip length. Without any total internal reflection (TIR) facets, as is illustrated in FIG. 2A, the chip length is slightly longer than the cavity length since etched facets are used and the chip cannot be singulated exactly at the position of the etched facet without destroying the etched facet. The example in FIG. 2B contains four TIR facets and results in a chip length of 585 µm. FIG. 2C shows an example having eight TIR facets resulting in a chip length of 325 µm, while the example in FIG. 2D has twelve TIR facets resulting in a chip length of 240 µm. By using more TIR facets, significant reduction is obtained in the chip size, allowing more chips to be produced from a given wafer. By using a rectangular spiral-shaped cavity that starts about the perimeter of the chip, the maximum cavity length can be obtained with the minimum number of TIR facets. It is desirable to reduce the TIR facets in a cavity, since there is some loss associated with each TIR facet.

Figure 3:
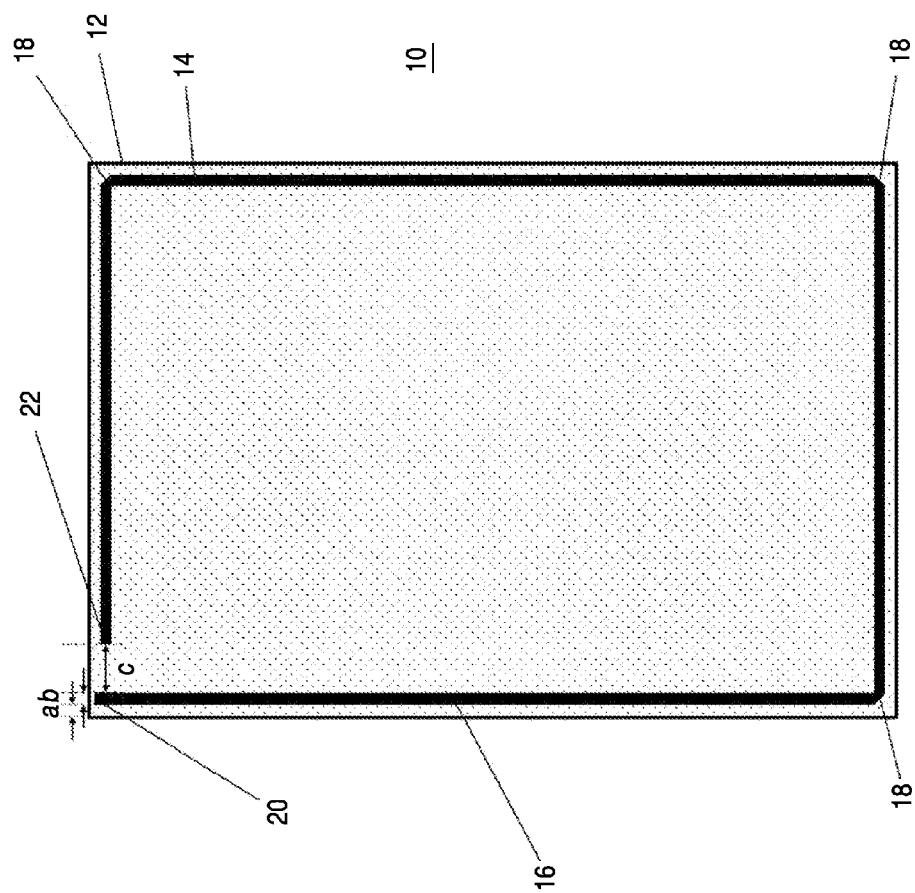
FIG. 3 shows a chip having a laser cavity using 45° incidence angle TIR facets around the perimeter of the chip so that light experiences a 90° angle change after reflection at each TIR facet.

FIG. 3 illustrates a laser 10 formed on a chip 12 where four legs 14 of a ridge or buried heterostructure (BH) waveguide define a laser cavity 16 and the legs 14 are placed close to the perimeter of the laser chip 12 using three TIR facets 18. The cavity 16 also includes an etched front facet 20 and an etched back facet 22. Preferably, the TIR facets 18 are positioned at 45° to the legs 14 so that the incidence angle to each TIR facet 18 is 45° and the light experiences a 90° change in direction after the reflection at the TIR facet 18. The lateral location of the laser cavity 16 is defined preferably by a distance between the ridge or the buried heterostructure (BH) waveguide and the side of the chip 12 as indicated by a in FIG. 3. This distance a is critical in insuring that the singulation process that turns a wafer into chips does not damage the waveguide. The width of the ridge waveguide or the BH waveguide is shown as b. The resulting cavity 16 is a quadrilateral structure that preferably is rectangular in shape, though minor variances in the TIR facet angles could result in the cavity structure not having a true rectangular shape. In addition, a gap c is deliberately left between the back facet 22 that is the termination of the fourth leg and the ridge or the BH in the first of the legs 14. The reason for this gap is to avoid unwanted reflections from reaching the back facet 22. Examples of the values of a, b, and c are 20 µm, 2 µm, and 50 µm, respectively.

In the present invention, it is preferable that the ridge waveguide width be of dimensions smaller than 3 µm to ensure single lateral mode operation. The BH waveguide is one that only supports a single lateral mode.

Figure 4B:
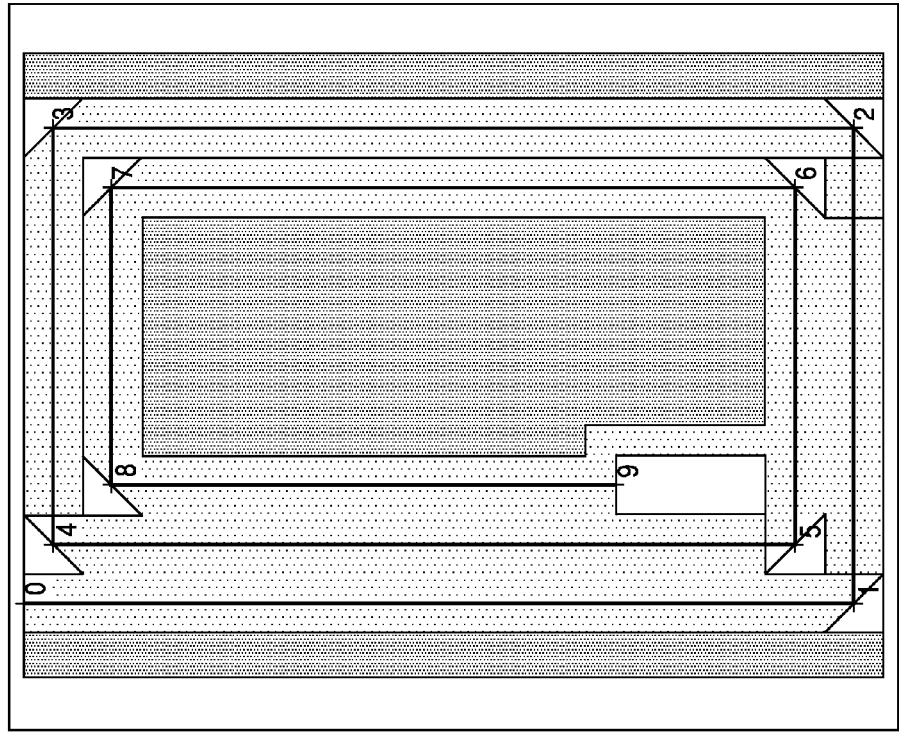
FIGS. 4A-4C show examples of the impact of ridge-to-ridge (RR) spacing, cavity length, and bond pad width or diameter, while the chip length and width is kept constant at 300 µm and 250 µm, respectively, the number of TIR facets is kept constant at eight, and there is a constant 50 µm gap at the back-facet.
Figure 4A:
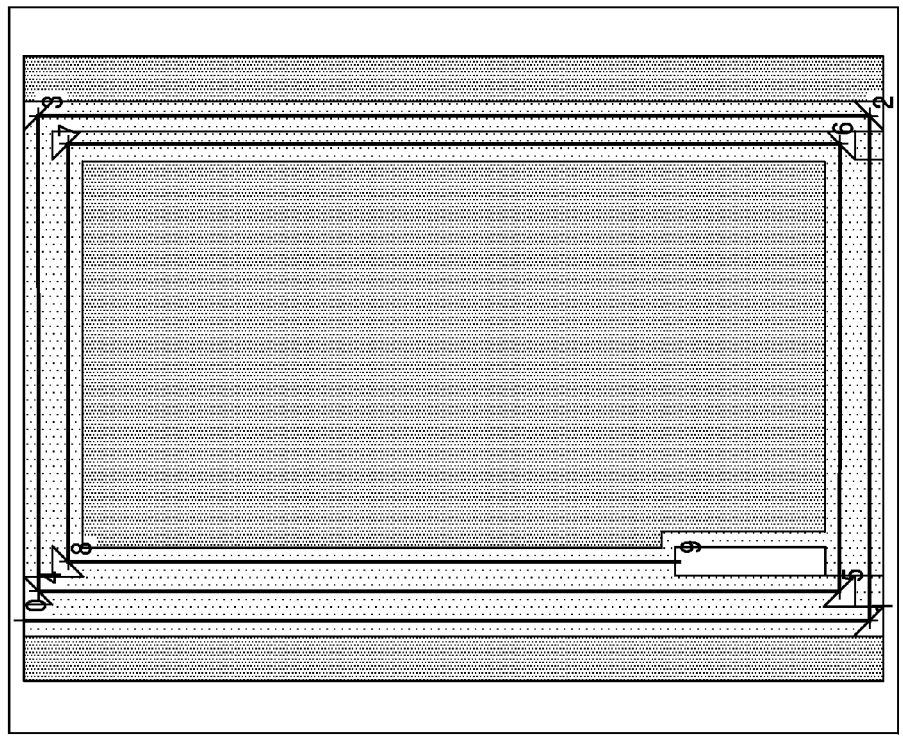
Figure 4C:
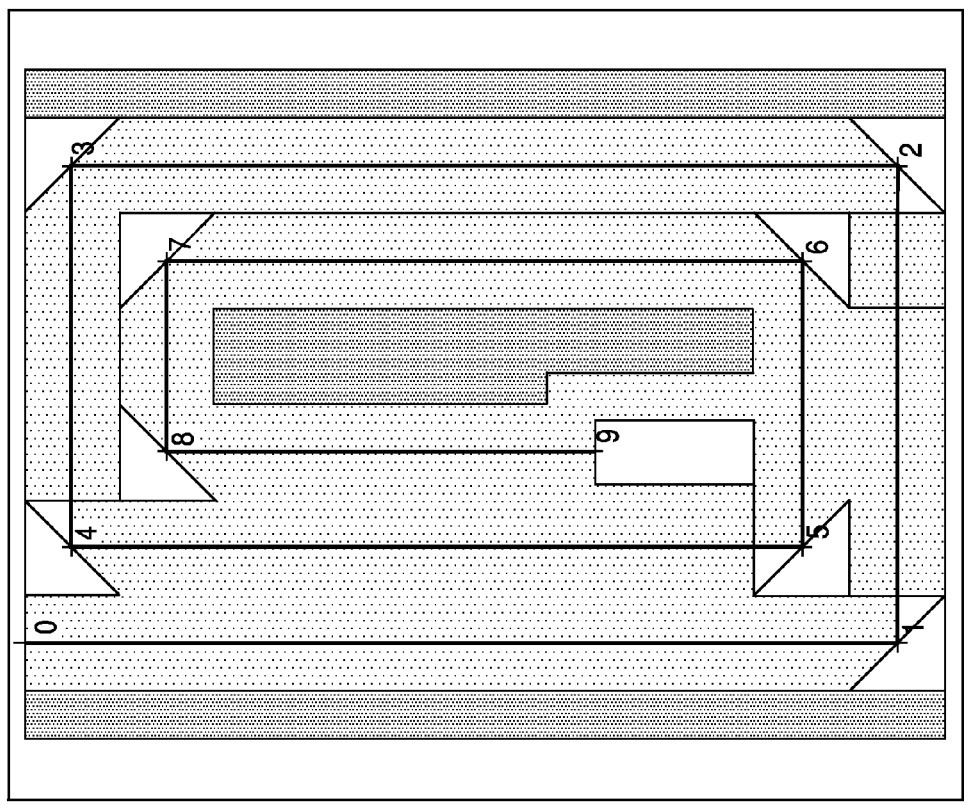
Figure 4D:
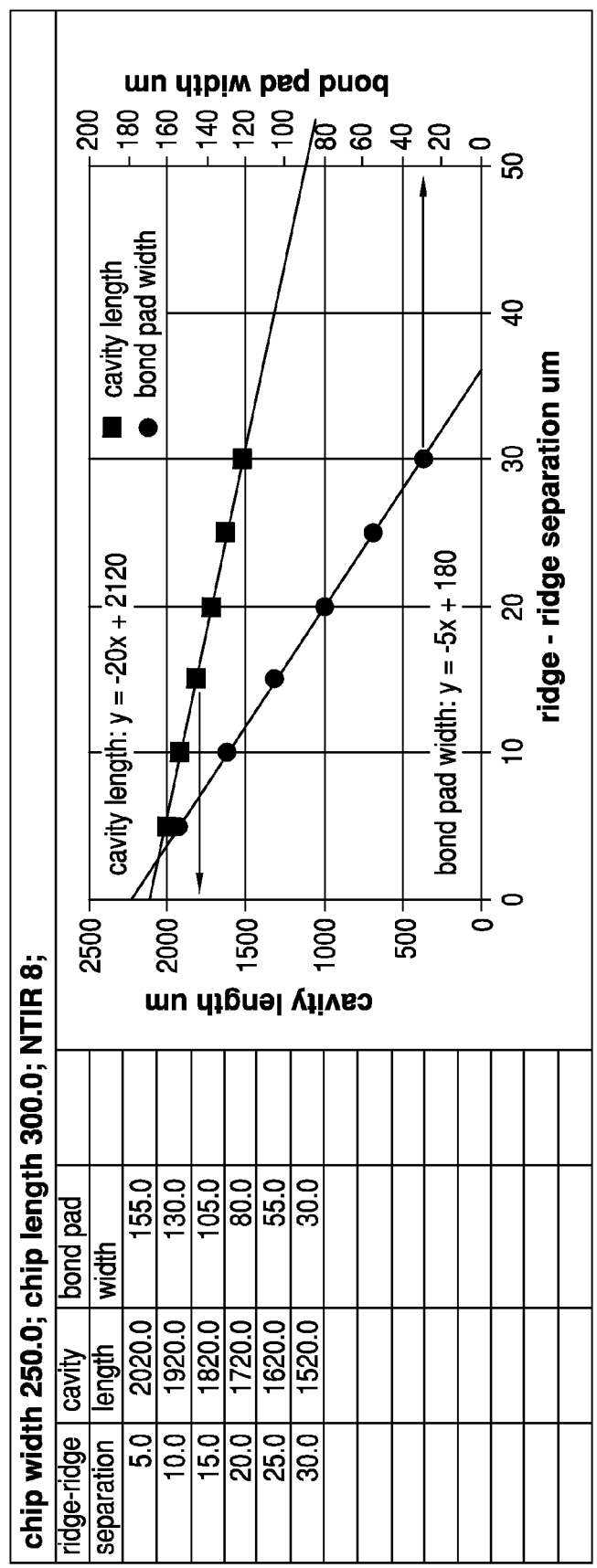
FIG. 4D is combination table and graph that illustrates the relationships among RR spacing, cavity length, and bond pad width.

FIGS. 4A-4C show examples of the impact of the distance between adjacent ridge waveguides (although adjacent ridge waveguides will be discussed from here only, it will be understood that adjacent BH waveguides could also be a used), cavity length, and bond pad width, while the chip length and width is kept constant at 300 µm and 250 µm, respectively, the number of TIR facets is kept constant at eight, and there is a constant 50 µm gap (parameter c). The example shown in FIG. 4A has a ridge-to-ridge (RR) spacing of 10 µm which results in a cavity length of 1920 µm and a bond pad width of 130 µm. The example shown in FIG. 4B has an RR spacing of 20 µm which results in a cavity length of 1720 µm and a bond pad width of 80 µm. Finally, the example shown in FIG. 4C has an RR spacing of 30 µm which results in a cavity length of 1520 µm and a bond pad spacing of 30 µm. The foregoing relationships among RR spacing, cavity length and bond pad width are illustrated in the table and graph of FIG. 4D.

Figure 5A:
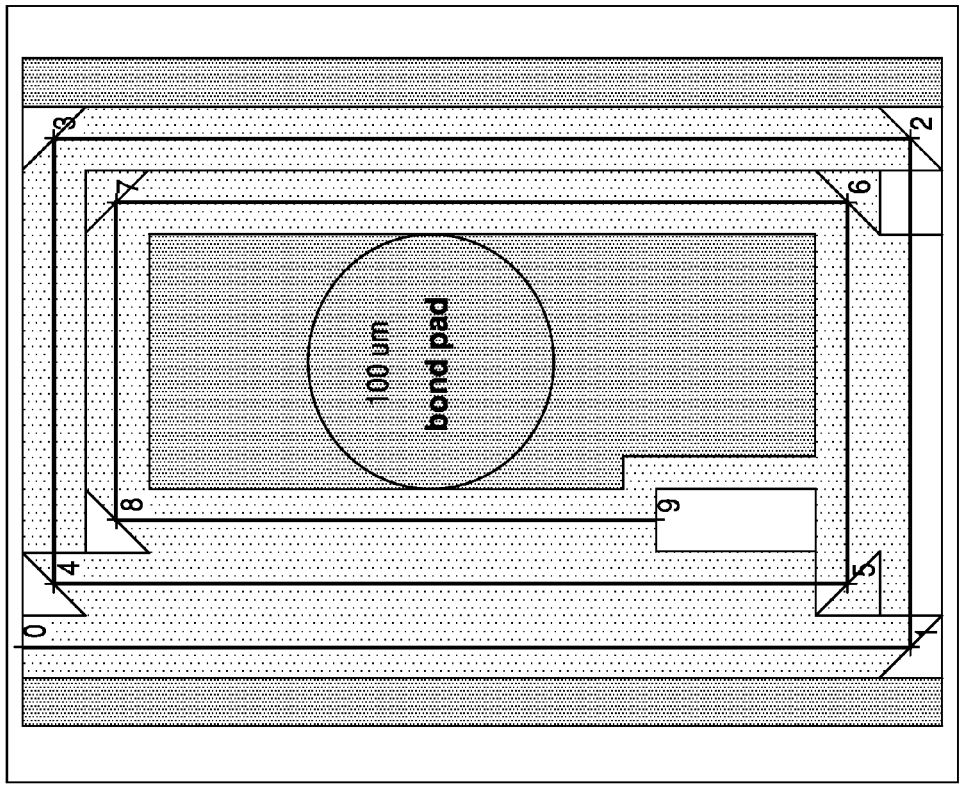
FIGS. 5A-5C show examples of the impact on chip length while the RR spacing is kept constant at 16 µm, the bond pad diameter is kept constant at 100 µm, the chip width is kept constant at 250 µm, the number of TIR facets is kept constant at eight, and there is a constant 50 µm gap at the back-facet.
Figure 5B:
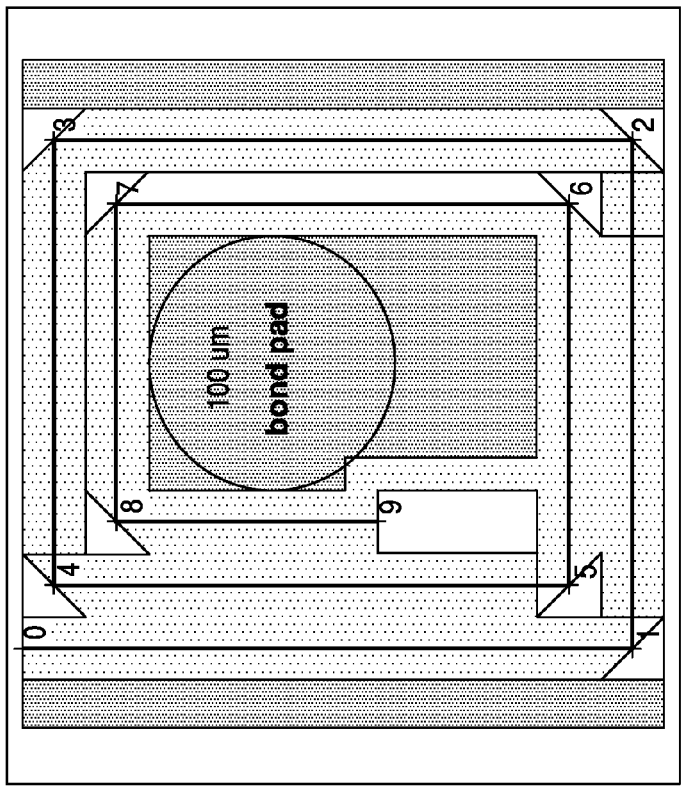
Figure 5C:
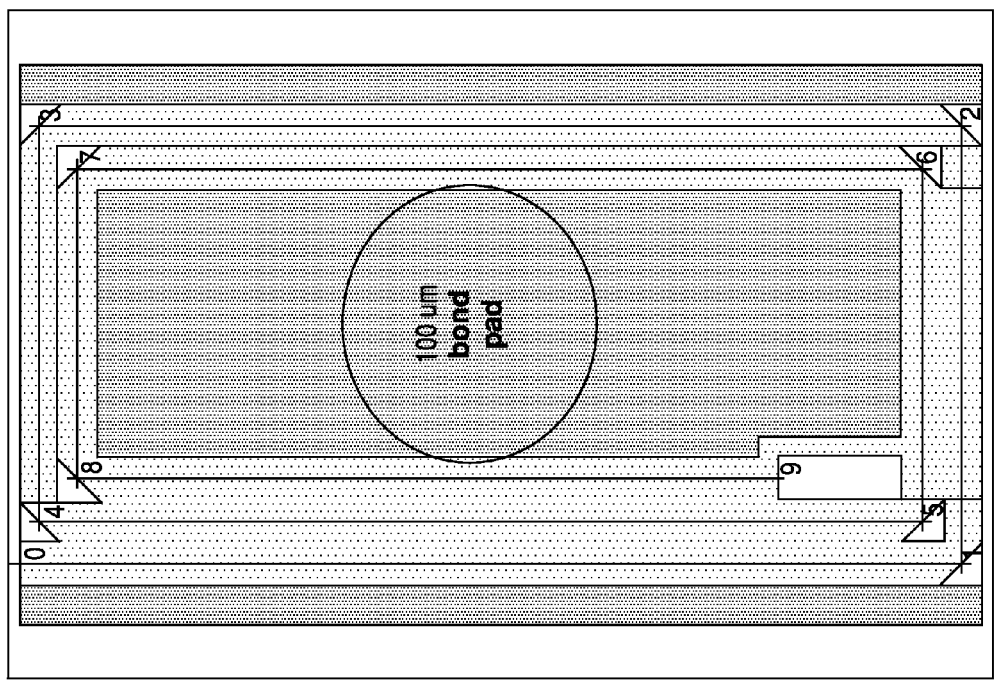
Figure 5D:
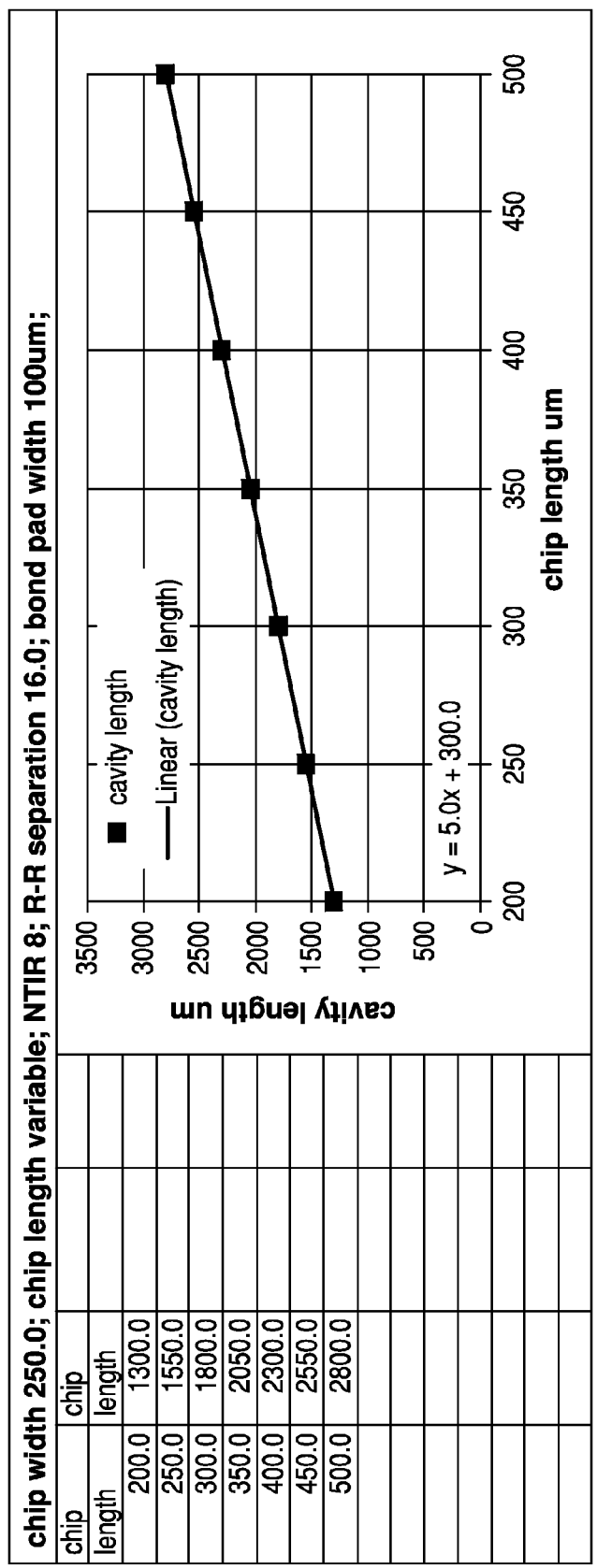
FIG. 5D is combination table and graph that illustrates the relationships between cavity length and chip length.

FIGS. 5A-5C show three examples of the impact on chip length for different length cavities while the distance between adjacent ridge waveguides is kept constant at 16 µm, the bond pad diameter is kept constant at 100 µm, the chip width is kept constant at 250 µm, the number of TIR facets is kept constant at eight, and there is a constant 50 µm gap (parameter c). In FIG. 5A, the chip length is 200 µm and the cavity length is 1300 µm; in FIG. 5B the chip length is 300 µm and the cavity length is 1800 µm; and in FIG. 5C, the chip length is 400 µm and the cavity length is 2300 µm. The foregoing relationships between cavity length and chip length are illustrated in the table and graph of FIG. 5D.

In practice, bonding to a bond pad of a diameter below 50 µm becomes very difficult with present-day wire-bonders. The bond pad can be placed above at least a portion of the laser cavity and the space allocated for the bond pad eliminated.

Compared to prior art work in U.S. Patent Application 2006/0274802 where the chip length was reduced by only 33%, we see that using TIR in the manner described according to the present invention, significant reduction in chip length is possible, for example 83% reduction. This allows significantly more chips to be fabricated from a given wafer, thereby reducing cost drastically.

FIG. 3 shows the case where no adjacent ridge waveguides or adjacent BH waveguides are present, however, FIG. 2B illustrates the situation where adjacent ridge waveguides are present in the rectangular spiral shaped cavity and the distance between them becomes a consideration.

Figure 6A:
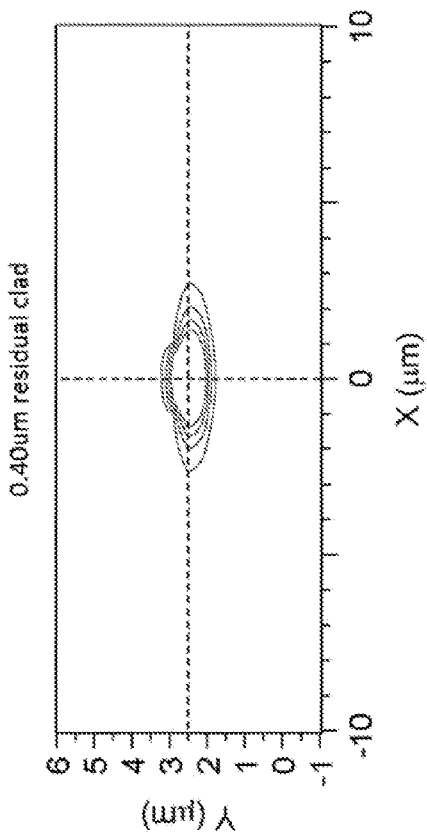
FIGS. 6A and 6B are graphical depictions of the $E_x$ mode profiles for ridge waveguides with 0.40 µm and 0.50 µm residual upper cladding thickness, respectively.
Figure 6B:
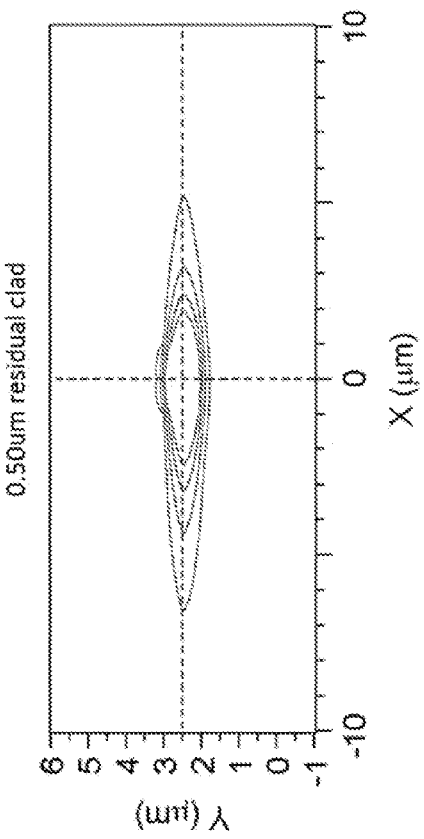
Figure 6C:
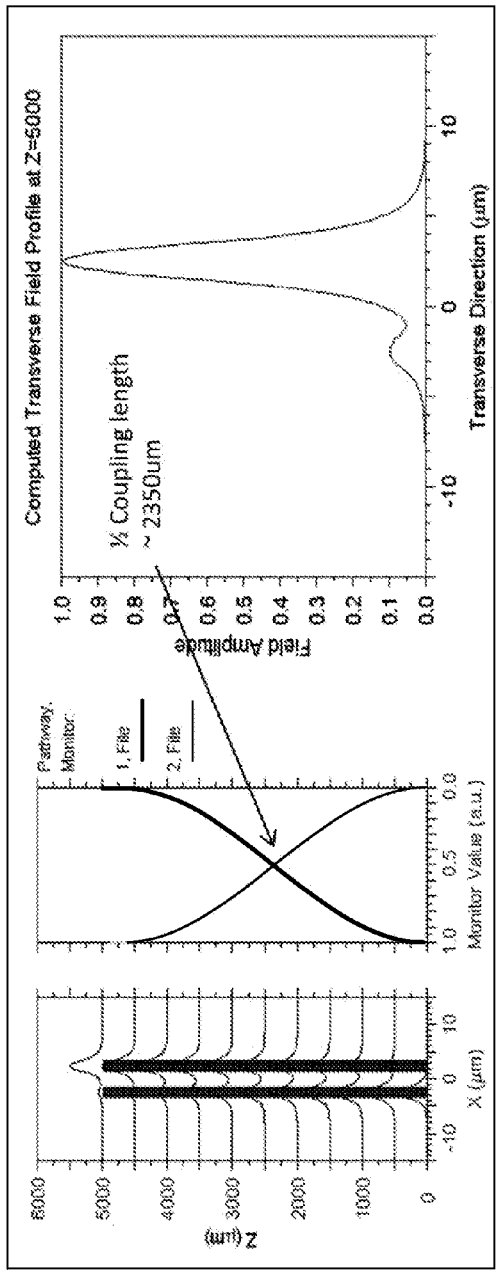
FIGS. 6C and 6D graphically depict the power exchange between two ridge waveguides spaced 5 µm apart with FIG. 6C showing the results for 0.40 µm residual upper cladding thickness and FIG. 6D showing the results for 0.50 µm residual upper cladding thickness.
Figure 6D:
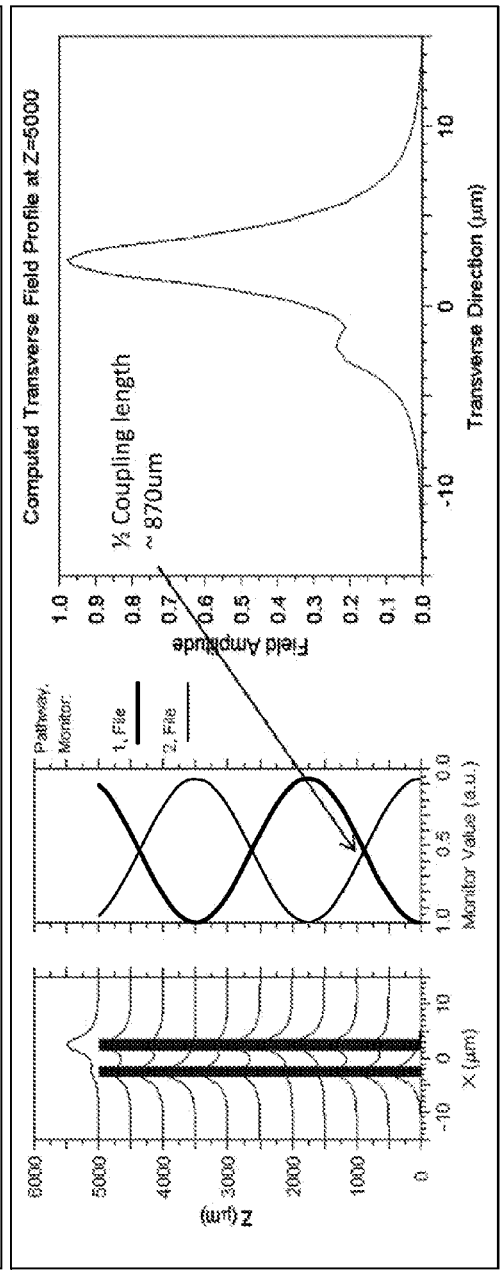

FIGS. 6A-6D illustrate the importance of lateral beam profile for the case of an 808-nm laser in causing coupling between two adjacent ridges. FIGS. 6A and 6B are depictions of the mode profiles for 0.40 μm and 0.50 μm residual upper cladding thickness, respectively. The thickness of the remaining upper cladding outside the ridge is called residual upper cladding thickness. In these figures, both contours of modes are 4 contours at 0.1, 0.2, 0.3 and 0.4 of the electric field amplitude, $E_x$. The peak value of $E_x$ is normalized to 1. The inner most contour is at 0.4 and the outermost contour is 0.1. When the ridges are spaced apart by 20 μm or more, there is essentially no coupling between ridges with 0.40 μm residual upper cladding thickness and very little coupling between ridges with 0.50 μm residual upper cladding thickness. However, as illustrated in the graphs of FIGS. 6C and 6D, which show the power exchange between two close ridges when the RR spacing is 5 μm, substantial coupling occurs between the ridges, especially in the case of ridges with 0.50 μm residual upper cladding thickness (FIG. 6D).

Figure 7A:
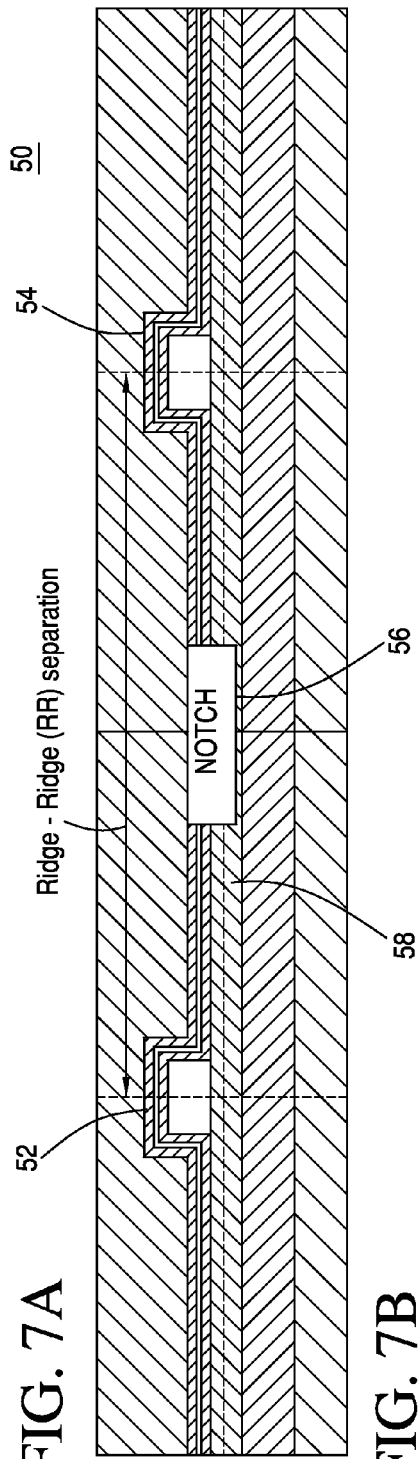
FIG. 7A shows an embodiment of the invention in which a notch is introduced between two adjacent ridge waveguides to reduce light coupling between the adjacent ridge waveguides.
Figure 7B:
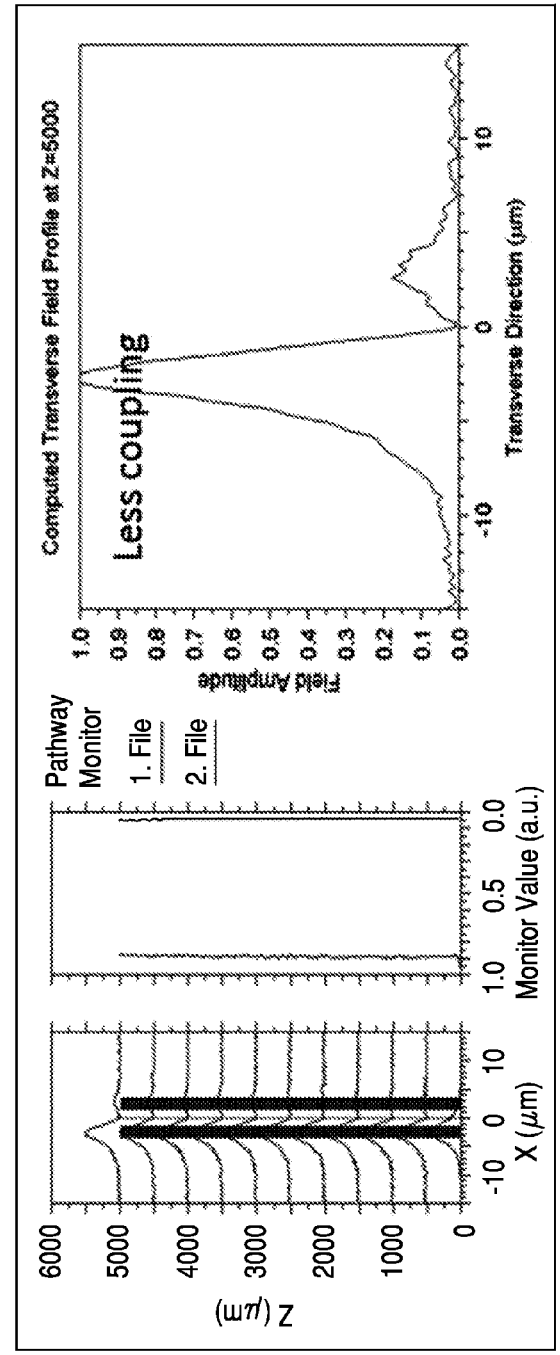
FIG. 7B graphically depicts the reduced coupling between the adjacent ridge waveguides when the notch is employed.

To address the foregoing coupling problem between closely spaced adjacent ridges, the technique illustrated in FIG. 7A can be employed. FIG. 7A shows a partial cross sectional view of a laser structure 50 that is configured in accordance with the embodiments of the invention illustrated in FIGS. 4A-4C and 5A-5C, for example. The laser structure 50 includes at least first and second adjacent ridge waveguides 52 and 54 that are spaced from one another by a distance RR. To reduce the coupling between the two ridge waveguides 52 and 54, a notch 56 is formed in the laser substrate 58 between the two ridge waveguides 52 and 54. The notch 56 is of a predetermined etch depth and width. The impact of the coupling between the two adjacent ridges is significantly reduced thereby as illustrated in the graphs of FIG. 7B as compared to the graphs of FIG. 6D, which shows the results of the same structure but without the notch.

It should be understood that the invention is applicable to laser structures in different material systems. Three examples of such structures are described below, all of which have been demonstrated to allow etched facets.

A wafer is fabricated with an n-InP cladding layer, an n-AlGaInAs SCH (separate confinement heterostructure) layer, AlGaInAs strained multi-quantum well active layers, a p-AlGaInAs SCH layer, a p-InP cladding layer and a highly doped p-InGaAs contact layer, formed successively on an n-type (100) InP substrate. The active region consisted of five 6 nm compressively strained AlGaInAs quantum wells separated by 10 nm tensile-strained AlGaInAs barrier layers; the band gap of the quantum well was about 1300 nm.

A wafer is fabricated with 2.0 μm n-$Al_{0.4}Ga_{0.6}As$ lower cladding; 0.1 μm $Al_{0.25}Ga_{0.75}As$ to $Al_{0.4}Ga_{0.6}As$ lower graded region; an active region containing a single 7.5 nm thick GaAs quantum well; 0.1 μm $Al_{0.4}Ga_{0.6}As$ to $Al_{0.25}Ga_{0.75}As$ upper graded region; 2.0 μm thick p-$Al_{0.4}Ga_{0.6}As$ upper cladding; and highly p-doped GaAs cap layer, formed successively on a GaAs substrate. The lasing wavelength is around 830 nm.

A wafer is fabricated with a lower cladding region of n-doped AlGaN, an active region with quantum wells and barriers of InAlGaN (Al and/or In can be zero in this composition), an upper cladding layer of p-doped AlGaN, and a highly p-doped cap layer of GaN and/or GaInN. The upper and lower cladding regions of the photonic structure had a lower index than the index of the active region, while the GaN and/or GaInN cap layer was provided to allow ohmic contacts. Although this example is based on providing a blue laser device on a GaN substrate, it will be understood that these devices can be formed to emit other wavelengths such as green and placed on other substrates such as Sapphire, SiC or AlN. As was described in U.S. Pat. No. 7,408,183, the disclosure of which is hereby incorporated herein by reference, structures of InAlGaN may have regions of low defect density and regions of high defect density. The cavity of the present invention would be positioned only in the low defect density region.

The invention is also applicable to lasers that have a front output facet and/or back facet that are etched at 90±1° to the substrate so that the laser is an edge-emitter or 45±1° to the substrate to allow the laser light to be emitted perpendicular to the surface of the substrate. Description of such structures is provided in U.S. Pat. No. 7,245,645, and U.S. patent application Ser. No. 12/725,894 the disclosures of which are hereby incorporated herein by reference. The front and back facets are both etched facets and using dielectric layers can have modifications in reflectivity, as described in U.S. Pat. No. 7,245,645.

Figure 8:
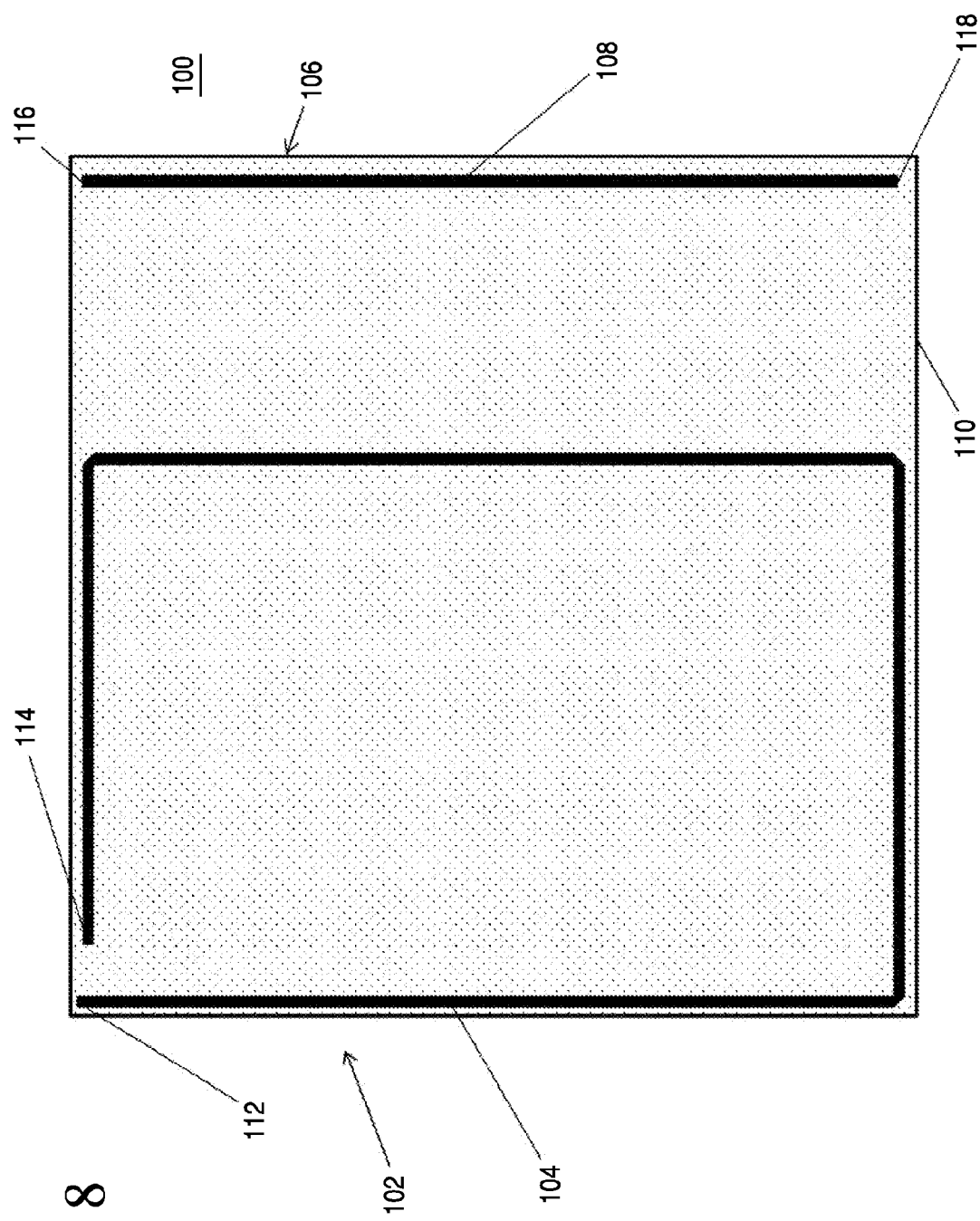
FIG. 8 shows an embodiment of the invention in which a first laser cavity using 45° incidence angle TIR facets around the perimeter of the chip is employed together a second laser cavity without any TIR facets.

FIG. 8 illustrates a laser structure 100 that is the combination of a first laser 102 like the laser from FIG. 3 including a first laser cavity 104 together with a second laser 106 including a second, straight laser cavity 108, both on the same chip 110. For example, the first laser 102 is formed in a first epitaxial deposited structure, forming a laser with a very long cavity 104, while the second laser 106 is formed in a second epitaxially deposited structure, forming a laser with a cavity length about the same as the length of the chip 110. Front and back facets 112 and 114, respectively, of the first laser cavity 104 are both etched, as are front and back facets 116 and 118, respectively, of the second laser cavity 108. If longer length is necessary, the second laser 106 may include TIR facets. An example of the use of such a chip is in dual wavelength operation where the first laser is a DVD laser and the second laser is a CD laser.

Figure 9:
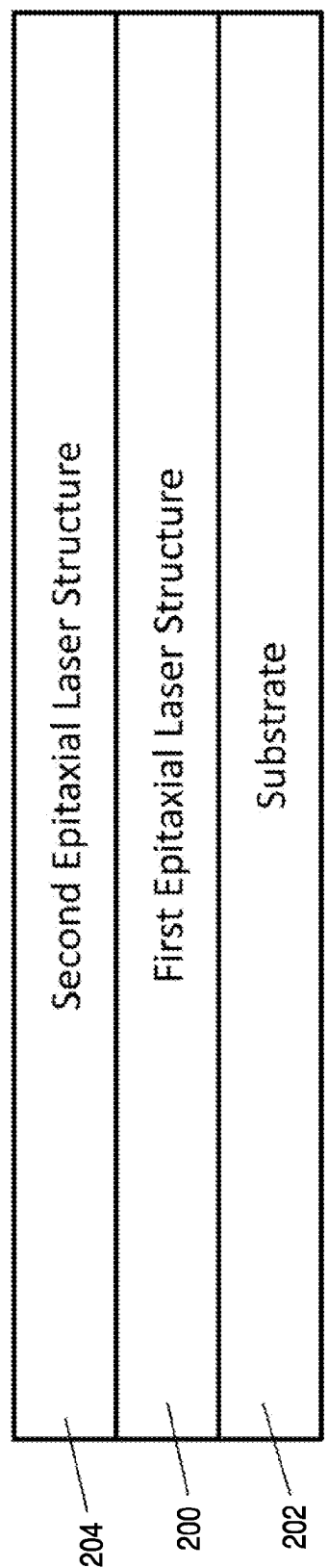
FIG. 9 shows a first epitaxial laser structure on a substrate, and a second epitaxial laser structure on the first epitaxial laser structure which can be employed with the embodiment of FIG. 8, for example.

FIG. 9 illustrates the case when the first epitaxial laser structure 200 is deposited on a substrate 202 and the second epitaxial laser structure 204 is deposited on the first laser epitaxial structure 200. Epitaxial deposition in this manner is less expensive than etching away a certain sections on the wafer to allow for a second epitaxial structure, since both epitaxial laser structures are deposited one after the other.

The epitaxial structure of FIG. 9 is used with 45±1° etched facets for the front facets 112 and 116 of the first and second lasers 102 and 104, respectively, of FIG. 8. The second epitaxial structure is removed from the first laser 102 to allow contacts to be applied to its structure. For example, this chip contains inexpensive dual cavity surface-emitting lasers for dual wavelength operation, such as DVD at 650 nm and CD at 780 nm, or blue and green emitting lasers.

Although the present invention has been illustrated in terms of preferred embodiments, it will be understood that variations and modifications may be made without departing from the true spirit and scope thereof as set out in the following claims.

The invention claimed is:

1. A semiconductor chip, comprising:
   a substrate having a length defining a length of said chip;
   a first epitaxial laser structure on said substrate;
   a first laser cavity formed by a waveguide in said first laser epitaxial structure; said waveguide being selected from the group comprising a ridge waveguide and a buried heterostructure (BH) waveguide;
   said cavity having a length greater than said chip length;
   said cavity having an etched front output facet and an etched back facet; and
   wherein at least part of said waveguide is formed along a perimeter of said chip.

2. The semiconductor chip of claim 1, wherein said waveguide is at a predetermined distance from an edge of the chip.

3. The semiconductor chip of claim 1, wherein said cavity includes a plurality of legs of said waveguide and said etched back facet is located at a predetermined distance from a different leg of the waveguide than that of a leg of the waveguide terminating in said back facet.

4. The semiconductor chip of claim 1, wherein said cavity length is selected to allow a bonding pad diameter above a predetermined value.

5. The semiconductor chip of claim 3, wherein said predetermined distance is above 50 µm.

6. The semiconductor chip of claim 1, wherein said etched front facet is at a 45±1° angle to said substrate.

7. The semiconductor chip of claim 1, wherein said etched front facet is at a 90±1° angle to said substrate.

8. The semiconductor chip of claim 1, wherein said waveguide includes a plurality of legs and the cavity contains one or more total internal reflection (TIR) etched facets that connect said legs.

9. The semiconductor chip of claim 8, wherein each of said TIR etched facets is at a 45° angle to a corresponding pair of said legs of said waveguide that said TIR etched facet connects.

10. A semiconductor chip, comprising:
    a substrate having a length defining a length of said chip;
    a first epitaxial laser structure on said substrate;
    a first laser cavity formed by a waveguide in said first laser epitaxial structure on said substrate; said waveguide being selected from the group comprising a ridge waveguide and a buried heterostructure (BH) waveguide;
    wherein said cavity has a length greater than said chip length, is formed from at least five legs of said waveguide and contains at least four total internal reflection (TIR) etched facets, each of which is at a 45° angle to a corresponding pair of said legs of said waveguide, wherein at least two of said legs of said waveguide are adjacent one another and the distance between the adjacent legs is above a predetermined value; and
    said cavity having an etched front output facet and an etched back facet.

11. A semiconductor chip, comprising:
    a substrate having a length defining a length of said chip;
    a first epitaxial laser structure on said substrate; wherein said epitaxial structure is InAlGaN containing regions of high defect density and regions of low defect density, and wherein said cavity is contained within said regions of low defect density;
    a first laser cavity formed by a waveguide in said first epitaxial structure; said waveguide being selected from the group comprising a ridge waveguide and a buried heterostructure (BH) waveguide;
    said cavity having a length greater than said chip length; and
    said cavity having an etched front output facet and an etched back facet.

12. The semiconductor chip of claim 1, wherein said front facet and said back facet have reflectivity modification through the deposition of dielectric layers at each of said facets.

13. A semiconductor chip, comprising:
    a substrate having a length defining a length of said chip;
    a first epitaxial laser structure on said substrate;
    a first laser cavity formed by a first waveguide in said first laser epitaxial structure, said waveguide being selected from the group comprising a ridge waveguide and a buried heterostructure (BH) waveguide;
    said first laser cavity having a length greater than said chip length; and having an etched front output facet and an etched back facet;
    a second epitaxial laser structure on said substrate; and
    a second laser cavity formed by a second waveguide in said second epitaxial structure; said waveguide being selected from the group comprising a ridge waveguide and a buried heterostructure (BH) waveguide;
    said second laser cavity having a having an etched front output facet and an etched back facet.

14. A semiconductor chip, comprising:
    a substrate having a length defining a length of said chip;
    a first epitaxial laser structure on said substrate;
    a first laser cavity formed by a first waveguide in said first laser epitaxial structure, said waveguide being selected from the group comprising a ridge waveguide and a buried heterostructure (BH) waveguide;
    said first laser cavity having a length greater than said chip length; and having an etched front output facet and an etched back facet;
    a second epitaxial laser structure deposited on said first epitaxial laser structure; and
    a second laser cavity formed by a second waveguide in said second epitaxial structure; said waveguide being selected from the group comprising a ridge waveguide and a buried heterostructure (BH) waveguide;
    said second laser cavity having a having an etched front output facet and an etched back facet.

15. The semiconductor chip of claim 14, wherein said second epitaxial structure is removed from a portion of said first epitaxial structure.

16. The semiconductor chip of claim 15, wherein said front output facet of said first laser is etched at 45±1° to said substrate and said front facet of said second laser is etched at 45±1° to said substrate.

17. A semiconductor chip, comprising:
    a substrate having a length defining a length of said chip;
    a first epitaxial laser structure on said substrate;
    a first laser cavity formed by a waveguide in said first epitaxial laser structure; said waveguide being selected from the group comprising a ridge waveguide and a buried heterostructure (BH) waveguide;
    said cavity having a length greater than said chip length;
    said cavity having an etched front output facet and an etched back facet; and
    wherein said cavity includes a least a first section that is generally rectangular shaped with first, second, third and fourth segments of said waveguide, wherein said back facet is formed at a termination of said fourth segment and a gap is formed between said back facet and said first segment of the waveguide.

18. The semiconductor chip of claim 10, further comprising an etched notch of a predetermined width and depth formed between adjacent legs of said waveguide.

19. The semiconductor chip of claim 13, wherein said second cavity comprises at least one TIR facet.

20. A semiconductor chip, comprising:
a substrate having a length defining a length of said chip;
a first epitaxial laser structure on said substrate;
a first laser cavity formed by a waveguide in said epitaxial laser structure; said waveguide being selected from the group comprising a ridge waveguide and a buried heterostructure (BH) waveguide;
said cavity having a quadrilateral spiral shape and a length greater than said chip length; and
said cavity having an etched front output facet and an etched back facet.

21. The semiconductor chip of claim 20, wherein said first laser cavity has a rectangular spiral shape.

* * * * *